(12) United States Patent
Tomiyama

(10) Patent No.: US 8,129,451 B2
(45) Date of Patent: Mar. 6, 2012

(54) SEALING FILM FOR SOLAR CELL AND SOLAR CELL OBTAINED BY USE OF THE SEALING FILM

(75) Inventor: Makiko Tomiyama, Yokohama (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 12/744,237

(22) PCT Filed: Nov. 21, 2008

(86) PCT No.: PCT/JP2008/071207
§ 371 (c)(1),
(2), (4) Date: May 21, 2010

(87) PCT Pub. No.: WO2009/069543
PCT Pub. Date: Jun. 4, 2009

(65) Prior Publication Data
US 2010/0286315 A1 Nov. 11, 2010

(30) Foreign Application Priority Data

Nov. 29, 2007 (JP) .................................. 2007-308893
Oct. 9, 2008 (JP) .................................. 2008-262428

(51) Int. Cl.
*C08K 5/3492* (2006.01)

(52) U.S. Cl. ........................................................ 524/91
(58) Field of Classification Search ........................ 524/91
See application file for complete search history.

(56) References Cited

U.S. PATENT DOCUMENTS

2010/0300531 A1* 12/2010 Kataoka ........................ 136/259

FOREIGN PATENT DOCUMENTS

| JP | 06-177412 A | 6/1994 |
| JP | 08-148708 A | 6/1996 |
| JP | 09-153635 A | 6/1997 |
| JP | 2006-134970 A | 5/2006 |
| WO | 2006/085603 A1 | 8/2006 |

* cited by examiner

*Primary Examiner* — Peter Szekely
(74) *Attorney, Agent, or Firm* — Sughrue Mion, PLLC

(57) ABSTRACT

A sealing film for a solar cell is provided, which has excellent ultraviolet resistance. The sealing film for a solar cell according to the present invention includes ethylene-vinyl acetate copolymer; an organic peroxide; a benzotriazole-based ultraviolet absorber; and a hindered amine-based light stabilizer. The content of the benzotriazole-based ultraviolet stabilizer is in the range of 0.01 to 0.3 parts by weight, based on 100 parts by weight of ethylene-vinyl acetate copolymer. Further, the content of the hindered amine-based light stabilizer is in the range of 0.01 to 2 parts by weight, based on 100 parts by weight of ethylene-vinyl acetate copolymer.

9 Claims, 1 Drawing Sheet

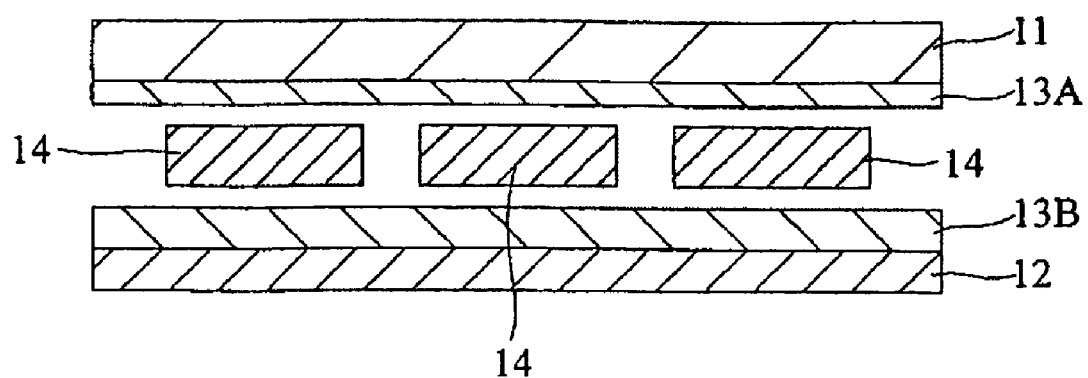

SEALING FILM FOR SOLAR CELL AND SOLAR CELL OBTAINED BY USE OF THE SEALING FILM

FIELD OF THE INVENTION

The present invention relates to a sealing film for a solar cell comprising as a main component ethylene-vinyl acetate copolymer, and a solar cell obtained by use of the sealing film. The present invention particularly relates to a sealing film having excellent ultraviolet resistance, and a solar cell including the sealing film.

DESCRIPTION OF THE RELATED ART

In recent years, a solar cell, that is, a device directly converting solar energy into electric energy calls attention, from the viewpoints of effective use of natural resources and prevention of environmental pollution. The development of the solar cells is being carried out.

As shown in FIG. 1, a solar cell generally includes a light-receipt side transparent protection member 11, a light-receipt side sealing film 13A, photovoltaic cells 14 such as photovoltaic elements made of silicon, a back side sealing film 13B, and a back side protection member (back cover) 12, which are successively superimposed in this order. After the solar cell is subjected to vacuum degassing, heat and pressure are applied to the solar cell so that the light-receipt side sealing film 13A and back side sealing film 13B are made adhesively integral with each other by crosslinking or curing the films 13A and 13B. Known solar cells are prepared by connecting a plurality of photovoltaic cells 14 for generating a large electricity output. For maintaining the electric insulation property among the photovoltaic cells 14, the sealing layers 13A and 13B having electric insulation property are used for sealing the photovoltaic cells 14.

Materials such as ethylene-vinyl acetate copolymer (EVA) is preferably used as light-receipt side- and back side sealing films 13A and 13B, because EVA is low priced and has an excellent transparency (Patent literature 1). Moreover, the crosslinking density of the sealing films is improved by adding a crosslinking agent such as organic peroxide to ethylene-vinyl acetate copolymer, in addition to the ethylene-vinyl acetate copolymer, for improving the film strength and the durability.

In the solar cell, it is strongly desired that light incident on the solar cell is effectively taken into the photovoltaic elements of the solar cell as much as possible, for improving power generation efficiency. Hence, the sealing film is desired to have high transparency, and therefore has properties for transmitting almost all the incident solar light without absorbing and reflecting the same.

When the solar cell is used for a long time period, however, ethylene vinyl acetate copolymer is deteriorated due to the influence of ultraviolet light. As a result, deterioration of the sealing film such as yellowing and poor adhesion property occurs. When the sealing film is yellowed, not only the power generation property of the sealing film, but also aesthetic property thereof are also decreased.

In known sealing films, the ultraviolet resistance is improved by adding an ultraviolet absorber such as a benzophenone-based absorber; a light stabilizer such as phenol-based stabilizer, sulfur-based stabilizer, phosphor-based stabilizer, amine-based stabilizer, hindered phenol-based stabilizer, hindered amine-based stabilizer, or hydrazine-based stabilizer; and yellowing prevention agent to the film material, further to the use of EVA and organic peroxides.
Patent Publication: JP-A 06-177412

SUMMARY OF THE INVENTION

Problem to be Solved by the Invention

It was possible in a solar cell having a known sealing film that the sealing film is deteriorated after a long term use so that the power generating property and the aesthetic property of the film are decreased. Therefore, it is necessary to further improve the ultraviolet resistance of the sealing film.

It is therefore an object of the present invention to provide a sealing film for a solar cell having an excellent ultraviolet resistance.

Means for Solving the Problems

The inventor of the present invention variously studied on the above-discussed object. As a result, the inventor founds that the ultraviolet resistance of a sealing film comprising ethylene-vinyl acetate copolymer can be improved by the co-use of a benzotriazole-based ultraviolet absorber and a hindered amine-based light stabilizer, due to the remarkable synergetic effect thereof.

On the other hand, when the benzotriazole-based ultraviolet absorber and hindered amine-based light stabilizer are added to the sealing film in a large quantity for obtaining a sufficient ultraviolet resistance, it is possible that the transparency of the film is decreased. To the contrary, when the amount of the benzotriazole-based ultraviolet absorber and hindered amine-based light stabilizer is too small, it is sometimes impossible to satisfactory improve the ultraviolet resistance of the film. Accordingly, it is necessary to add each of the benzotriazole-based ultraviolet absorber and hindered amine-based light stabilizer in an appropriate amount for improving the ultraviolet resistance of the sealing film without decreasing the transparency thereof.

The above object is attained by the present invention, i.e., a sealing film for a solar cell comprising, ethylene-vinyl acetate copolymer, an organic peroxide; a benzotriazole-based ultraviolet absorber; and a hindered amine-based light stabilizer; the content of the benzotriazole-based ultraviolet stabilizer being in the range of 0.01 to 0.3 parts by weight, based on 100 parts by weight of ethylene-vinyl acetate copolymer, and the content of the hindered amine-based light stabilizer being in the range of 0.01 to 2 parts by weight, based on 100 parts by weight of ethylene-vinyl acetate copolymer.

The preferred embodiments of the sealing film for a solar cell according to the present invention will be described below.

(1) The content of the benzotriazole-based ultraviolet absorber is in the range of 0.05 to 0.1 parts by weight, based on 100 parts by weight of ethylene-vinyl acetate copolymer.

(2) The content of the hindered amine-based light stabilizer is in the range of 0.05 to 1.5 parts by weight, based on 100 parts by weight of ethylene-vinyl acetate copolymer.

(3) The weight ratio of the benzotriazole-based ultraviolet absorber and hindered amine-based light stabilizer is in the range of 1:1 to 1:5.

(4) The benzotriazole-based ultraviolet absorber is 2-(2H-benzotriazol-2-yl)-6-dodecyl-4-methylphenol, 2-[5-chloro (2H)-benzotriazol-2-yl]-4-methyl-6-tert-butylphenol, and/or 2,2'-methylenebis-[6-(2H-benzotriazole-2-yl)-4-(1,1,3,3-tetramethylbutyl)phenol.

(5) The hindered amine-based light stabilizer is bis(2,2,6,6-tetramethyl-4-piperidyl) sebacate, and/or poly[{6-(1,1,3,3-tetramethylbutyl)amino-1,3,5-triazine-2,4-diyl}{(2,2,6,6-tetramethyl-4-piperidyl)imino}hexamethylene {(2,2,6,6-tetramethyl-4-piperidyl)imino}].

(6) The organic peroxide is at least one material selected from a group consisting of hydroperoxide-based compounds, dialkylperoxide-based compounds and ketone peroxide-based compounds.

(7) The content of the organic peroxide is in the range of 0.2 to 1.5 parts by weight, based on 100 parts by weight of ethylene-vinyl acetate copolymer.

(8) The content of vinyl acetate in ethylene-vinyl acetate copolymer is in the range of 20 to 35 parts by weight, based on 100 parts by weight of ethylene-vinyl acetate vinyl copolymer.

Effect of the Invention

In the sealing film for a solar cell according to the present invention, a benzotriazole-based ultraviolet absorber and a hindered amine-based light stabilizer are used in combination, with optimizing the contents of the ultraviolet absorber and the light stabilizer. As a result, the yellowing and the decrease of adhesion property are largely restricted in the sealing film even after the long-term use of the film, which also has excellent ultraviolet resistance. Furthermore, the transparency of the sealing film for the solar cell is not decreased even by the addition of benzotriazole-based ultraviolet absorber and hindered amine-based light stabilizer. A large ultraviolet absorption of the film can also be maintained for a long time in the sealing film. Accordingly, the sealing cell of the invention helps to minimize the deterioration of photovoltaic cell. Thus, it is possible to provide a solar cell which has excellent power generation property from the beginning, and to maintain the property for a long time, by using the sealing film for a solar cell of the invention.

DETAILED DESCRIPTION OF DRAWINGS

FIG. 1 is a cross section of a generally used solar cell.

| Explanation of Reference Numerals | |
|---|---|
| 11 | Front side transparent protection member |
| 12 | Back side protection member |
| 13A | Front side (light-receipt side) sealing film |
| 13B | Back side sealing film |
| 14 | Photovoltaic cell |

BEST MODE FOR CARRYING OUT THE INVENTION

A sealing film for a solar cell of the present invention, comprises, as main components, ethylene-vinyl acetate copolymer, an organic peroxide, a benzotriazole-based ultraviolet absorber, and a hindered amine-based light stabilizer. The present invention is characterized by the optimized contents of the benzotriazole-based ultraviolet absorber and the hindered amine-based light absorber.

In the sealing film for a solar cell of the invention, the content of the benzotriazole-based ultraviolet light absorber is in the range of 0.01 to 0.3 parts by weight, more preferably 0.05 to 0.3 parts by weight, and particularly preferably 0.05 to 0.1 parts by weight, based on 100 parts by weight of ethylene-vinyl acetate copolymer. Moreover, the content of hindered amine-based light stabilizer in the sealing film for a solar cell of the invention is in the range of 0.01 to 2 parts by weight, more preferably 0.05 to 0.2 parts by weight, particularly preferably 0.05 to 1.5 parts by weight, based on 100 parts by weight of ethylene-vinyl acetate copolymer. By including the ultraviolet light absorber and the light stabilizer in the above-described amount, it is possible to decrease the transparency, and to impart excellent ultraviolet light resistance to the sealing film.

The weight ratio (A:B) of the benzotriazole-based ultraviolet light absorber (A) and the hindered amine-based light stabilizer (B) are preferably in the range of 1:1 to 1:5, and particularly preferably in the range of 1:1 to 1:3.

The benzotriazole-based ultraviolet light absorber is preferably used which has a maximum absorption wavelength in the range of 330 to 360 nm, in particular in the range of 340 to 350 nm. The above-mentioned ultraviolet light absorber can especially absorb, an ultraviolet light included in the incident light which can optically degrade ethylene-vinyl acetate copolymer, to a great extent.

Specific examples of the ultraviolet light absorber includes 2-[2'-hydroxy-5'-(hydroxymethyl)phenyl]-2H-benzotriazole, 2-[2'-hydroxy-5'-(2-hydroxyethyl)phenyl]-2H-benzotriazole, 2-[2'-hydroxy-5'-(3-hydroxypropyl)phenyl]-2H-benzotriazole, 2-[2'-hydroxy-3'-methyl-5'-(hydroxymethyl)phenyl]-2H-benzotriazole, 2-[2'-hydroxy-3'-methyl-5'-(2-hydroxyethyl)phenyl]-2H-benzotriazole, 2[2'-hydroxy-3'-methyl-5'-(3-hydroxypropyl)phenyl]-2H-benzotriazole, 2-[2'-hydroxy-3'-t-butyl-5'-(hydroxymethyl)phenyl]-2H-benzotriazole, 2-[2'-hydroxy-3'-t-butyl-5'-(2-hydroxyethyl)phenyl]-2H-benzotriazole, 2-[2'-hydroxy-3'-t-butyl-5'-(2-hydroxyethyl)phenyl]-5-chloro-2H-benzotriazole, 2-[2'-hydroxy-3'-butyl-5'-(3-hydroxypropyl)phenyl]-2H-benzotriazole, 2-[2'-hydroxy-3'-t-octyl-5'-(hydroxymethyl)phenyl]-2H-benzotriazole, 2-[2'-hydroxy-3'-t-octyl-5'-(2-hydroxyethyl)phenyl]-2H-benzotriazole, and 2-[2'-hydroxy-3'-t-octyl-5'-(3-hydroxypropyl)phenyl-2H-benzotriazole; and 2,2'-methylenebis[6-(2H-benzotriazol-2-yl)-4-(hydroxymethyl)phenol], 2,2'-methylenebis[6-(2H-benzotriazol-2-yl)-4-(2-hydroxyethyl)phenyl], 2,2'-methylenebis[6-(5-chloro-2H-benzotriazol-2-yl)-4-(2-hydroxyethyl)phenol], 2,2'-methylenebis[6-(5-bromo-2H-benzotriazol-2-yl)-4-(2-hydroxyethyl)phenol], 2,2'-methylenebis[6-(2H-benzotriazol-2-yl)-4-(3-hydroxypropyl)phenol], 2,2'-methylenebis[6-(5-chloro-2H-benzotriazol-2-yl)-4-(3-hydroxypropyl)phenol], 2,2'-methylenebis[6-(5-bromo-2H-benzotriazol-2-yl)-4-(3-hydroxypropyl)phenol], 2,2'-methylenebis[6-(2H-benzotriazol-2-yl)-4-(4-hydroxybutyl)phenol], 2,2'-methylenebis[6-(5-chloro-2H-benzotriazol-2-yl)-4-(4-hydroxybutyl)phenol], 2,2'-methylenebis[6-(5-bromo-2H-benzotriazol-2-yl)-4-(4-hydroxybutyl)phenol], 3,3'-{2,2'-bis[6-(2H-benzotriazol-2-yl)-1-hydroxy-4-(2-hydroxyethyl)phenyl]propane, 2,2-{2,2'-bis[6-(2H-benzotriazol-2-yl)-1-hydroxy-4-(2-hydroxyethyl)phenyl]}butane, 2,2'-oxybis[6-(2H-benzotriazol-2-yl)-4-(2-hydroxyethyl)phenol], 2,2'-bis[6-(2H-benzotriazol-2-yl)-4-(2-hydroxyethyl)phenol]sulfide, 2,2'-bis[6-(2H-benzotriazol-2-yl)-4-(2-hydroxyethyl)phenol]sulfoxide, 2,2'-bis[6-(2H-benzotriazol-2-yl)-4-(2-hydroxyethyl)phenol]sulfone, 2,2'-bis[6-(2H-benzotriazol-2-yl)-4-(2-hydroxyethyl)phenol]amine, 2-(2H-benzotriazol-2-yl)-6-dodecyl-4-methylphenol, 2-[5-chloro(2H)-benzotriazol-2-yl]-4-methyl-6-tert-butylphenol, and 2,2'-methylenebis-[6-(2H-benzoriazol-2-yl)-4-(1,1,3,3-tatramethylbutyl)phenol. Each of the above can be used alone or two or more can be used as a mixture.

As the benzotriazole-based ultraviolet absorber, 2-(2H-benzotriazol-2-yl)-6-dodecyl-4-methylphenol, 2-[5-chloro (2H)-benzotriazol-2-yl]-4-methyl-6-tert-butylphenol, and 2,2'-methylenebis-[6-(2H-benzotriazole-2-yl)-4-(1,1,3,3-tetramethylburyl)phenol are particularly preferably used. The above-mentioned ultraviolet light absorber can especially absorb, to a great extent, an ultraviolet light having a wavelength of 330 nm contained in the incident light, which can optically degrade ethylene-vinyl acetate copolymer. Thus, it is possible to impart excellent ultraviolet resistance to the sealing film.

As the hindered amine-based light absorber to be used in the sealing film of the invention, it is possible to use conventionally known absorbers without any particular restrictions.

As low molecular-weight hindered amine-based light stabilizer, a mixture of 70 parts by weight of a reaction product (molecular weight: 737) of decanedioic acid bis(2,2,6,6-tetramethyl-1(octyloxy)-4-piperidinyl)ester, 1,1-dimethylethyl hydroperoxide, and octane, and 30 parts by weight of polypropylene;

bis(1,2,2,6,6-pentamethyl-4-piperidyl)[3,5-bis(1,1-dimethylethyl)-4-hydroxyphenyl]methyl]butylmalonate (molecular weight: 685);

a mixture of bis(1,2,2,6,6-pentamethyl-4-piperidyl)sebacate and methyl-1,2,2,6,6-pentamethyl-4-piperidyl sebacate (molecular weight: 509);

bis(2,2,6,6-tetramethyl-4-piperidyl)sebacate (molecular weight: 481); tetrakis (2,2,6,6-tetramethyl-4-piperidyl)-1,2,3,4-butanetetracarboxylate (molecular weight: 791);

tetrakis(1,2,2,6,6-pentamethyl-4-piperidyl)-1,2,3,4-butanetetracarboxylate (molecular weight: 847);

a mixture of 2,2,6,6-tetramethyl-4-piperidyl-1,2,3,4-butanetetracarboxylate and tridecyl-1,2,3,4-butanetetracarboxylate (molecular weight: 900); and a mixture of 1,2,2,6,6-pentamethyl-4-piperidyl-1,2,3,4-butanetetracarboxylate and tridecyl-1,2,3,4-butanetetracarboxylate (molecular weight: 900).

As high molecular-weight hindered amine-based light stabilizer, poly [{6-(1,1,3,3-tetramethylbutyl)amino-1,3,5-triazine-2,4-diyl}{(2,2,6,6-tetramethyl-4-piperidyl) imino}hexamethylene {(2,2,6,6-tetramethyl-4-piperidyl) imino (molecular weight: 2,000 to 3,100); polymer (molecular weight: 3,100 to 4,000) obtained from dimethyl succinate and 4-hydroxy-2,2,6,6-tetramethyl-1-piperidine ethanol; a mixture of N,N',N',N'''-tetrakis-(4,6-bis-(butyl-(N-methyl-2,2,6,6-tetramethylpiperidin-4-yl)amino)triadin-2-yl)-4,7-diazadecane-1,10-diamine (molecular weight: 2,286) and a polymer obtained from the above mentioned dimethyl succinate and 4-hydroxy-2,2,6,6-tetramethyl-1-piperidine ethanol; a polycondensation product (molecular weight: 2,600 to 3,400) of dibutylamine-1,3,5-triadine-N,N'-bis(2,2,6,6-tetramethyl-4-piperidyl-1,6-hexamethylenediamine and N-(2,2,6,6-tetramethyl-4-piperidyl) butylamine; and poly [{6-(1,1,3,3-tetramethylbutyl)amino-1,3,5-triazine-2,4-diyl}{(2,2,6,6-tetramethyl-4-piperidyl) imino}hexamethylene{(2,2,6,6-tetramethyl-4-piperidyl) imino (molecular weight: 2,000 t 3,100). Each of the above-mentioned hindered amine-based light stabilizers can be used alone, or two or more thereof can be used as a mixture.

As the hindered amine-based light stabilizer, bis(2,2,6,6-tetramethyl-4-piperidyl)sebacate and poly[{6-(1,1,3,3-tetramethylbutyl)amino-1,3,5-triazine-2,4-diyl}{(2,2,6,6-tetramethyl-4-piperidyl)imino}hexamethylene {(2,2,6,6-tetramethyl-4-piperidyl)imino}](molecular weight: 2,000 to 2,100). When used with the benzotriazole-based ultraviolet light absorber, these light stabilizers exhibit excellent synergetic effect, whereby an excellent ultraviolet resistance can be obtained in the sealing film.

The sealing film of the present invention further comprises an organic peroxide as a crosslinking agent. It is possible to use any organic peroxide as long as the organic peroxide decomposes at a temperature of 100° C. or more to generate radicals. Generally speaking, an organic peroxide to be used is selected, with the film forming temperature, conditions for formulating the composition, curing temperature, heat resistance of the adhesion substrate, and storage stability taking into account. In particular, it is preferable to use a material having a decomposition temperature of 70° C. in a 10-hour half-life time.

It is preferable to use hydroperoxide compounds, dialkyl peroxide compounds, and ketone peroxide compounds as the above-mentioned organic peroxide in the sealing film. This is because these compounds greatly prevents the sealing film from yellowing even when the film is used for a long time, and gives excellent ultraviolet resistance to the sealing film. Each of the peroxides can be used alone, or two or more thereof can be used as a mixture.

As the hydroperoxide-based compounds, P-menthane hydroperoxide, 1,1,3,3-tetramethylbutyl hydroperoxide, cumene hydroperoxide, t-hexyl hydroperoxide, and the like can be used.

Examples of the dialkyl peroxide-based compounds are 3-di-t-butylperoxide, t-butyl-α-cumyl peroxide, di-α-cumyl peroxide, 1,4-bis((t-butyldioxy)isopropyl)benzene, 1,3-bis ((t-butyldioxy)isopropyl)benzene, 2,5-dimethyl-2,5-bis(t-butylperoxy)benzene, 2,5-dimethyl-2,5-bis(t-butylperoxy) hexane, 2,5-dimethyl-2,5-bis(t-butylperoxy)hexine, α,α'-bis (tert-butyloxyisopropyl)benzene, n-butyl-4,4-bis(t-butylperoxy)butane, 2,2-bis(tert-butylperoxy)butane, and 1,1-bis(tert-butylperoxy) 3,3,5-trimethylcyclohexane.

Examples of the ketone peroxide compound include methyl ethyl ketone peroxide, methyl isobutyl ketone peroxide, cyclohexanone peroxide, and methyl cyclohexanone peroxide.

Among the above peroxides, dialkyl peroxide compounds, particularly 2,5-dimethyl-2,5-bis(t-butylperoxy)hexane is preferably used, by a sealing film for a solar cell having an excellent ultraviolet resistance is obtained.

The content of the organic peroxide in the sealing film is preferably in the range of 0.2 to 1.5 parts by weight, more preferably in the range of 0.5 to 1.0 parts by weight, based on 100 parts by weight of ethylene-vinyl acetate copolymer. When the content of the organic peroxide is smaller than in the above range, it is possible that the transparency of the sealing film is decreased. While when the content of the organic peroxide is larger than in the above range, it is possible that the solubility of the organic peroxide, with respect to the other components, becomes poor, and that sufficient ultraviolet resistance may not be obtained.

In the sealing film or a solar cell of the invention, ethylene-vinyl acetate copolymer (EVA) is used as an organic resin. Moreover, polyvinyl acetal resins (e.g., polyvinyl formal, polyvinyl butyral (PVB resin) and modified PVB), and vinyl chloride resin can be secondarily used. In that case, PVB is particularly preferred.

The content of the vinyl acetate included in the ethylene-vinyl acetate copolymer is preferably in the range of 20 to 35 parts by weight, more preferably in the range of 20 to 30 parts by weight, and particularly preferably in the range of 24 to 28 parts by weight, based on 100 parts by weight of ethylene-vinyl acetate copolymer. Consequently, it is possible to obtain a sealing film which has excellent transparency, and small degradation of EVA against application of the ultraviolet light incident to the sealing film.

The sealing film for a solar cell of the present invention can further comprise a silane coupling agent for improving the adhesion property with respect to the photovoltaic elements. The silane coupling agent used for this purpose can be known materials. Examples of the silane coupling agent include γ-chloropropyltrimethoxysilane, vinyltrichlorosilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, vinyltriacetoxysilane, γ-mercaptopropyltrimethoxysilane, γ-amino-propyltrimethoxysilane, and N-β-(aminoethyl)-γ-aminopropyltrimethoxysilane. The content of the silane coupling agent is preferably not more than 5 parts by weight, especially 0.1 to 2 parts by weight, based on 100 parts by weight of EVA.

The sealing film for a solar cell of the invention preferably contains a crosslinking auxiliary agent (compound having a radical polymerizable group as a functional group) to enhance gel fraction and durability of ethylene-vinyl acetate copolymer. Examples of the crosslinking auxiliary agents used for this purpose include tri-functional crosslinking auxiliary agents such as triallyl cyanurate and triallyl isocyanurate; mono- or di-functional crosslinking auxiliary agents such as (meth)acrylic esters (e.g., NK esters). The crosslinking auxiliary agent is generally used in the range of 10 parts by weight or less, preferably in the range of 0.1 to 5 parts by weight, and more preferably in the range of 0.5 to 3.5 parts by weight, based on 100 parts by weight of EVA.

In order to improve the stability of the ethylene-vinyl acetate copolymer, it is possible to add hydroquinone, hydroquinone monomethyl ether, p-benzoquinone, and methyl hydroquinone to the copolymer. These additives are used preferably in an amount of 5 parts by weight or less based on 100 parts by weight of the ethylene-vinyl acetate copolymer.

If necessary, the ethylene-vinyl acetate copolymer may further contain coloring agent, anti-aging agent, anti-discoloration agent, or the like. Examples of the coloring agent include inorganic pigments such as metallic oxide and metal powder, and organic pigments such as azo pigments, phthalocyanine pigments, azi pigments, acid dye pigments and basic dye lake pigments. Examples of the anti-aging agent are amine compounds, phenol compounds, and bisphenyl compounds.

The thickness of the sealing film for a solar cell of the invention is usually in the range of 20 μm to 2 mm.

It is possible that the sealing film for a solar cell of the invention can be prepared in accordance with a conventional film forming method such as extrusion molding, or calendar molding. Namely, the composition including the above-discussed materials for the sealing film can be made into a film form by stretching/extruding the composition by application of heat and pressure thereto. Alternatively, the composition can be dissolved in a solvent, the thus obtained solution can be applied to an appropriate support by an appropriate coater, and the applied solution can be dried to obtain a coated film. In this way, a sheet form material can be prepared. The heat application temperature is generally in the range of 50 to 90° C.

In a solar cell, the sealing film is crosslinked/cured for sealing the photovoltaic cell. The sealing film for the solar cell according to the present invention has excellent ultraviolet resistance even after crosslinking and curing for sealing the photovoltaic cell. Further, the deterioration of the film caused by ultraviolet irradiation such as yellowing or the decrease adhesion property is largely restricted. The transparency decrease of the sealing film, by the addition of benzotriazole-based ultraviolet absorber and hindered-amine based light stabilizer, is also minimized, and the high ultraviolet absorption property can be maintained for a long time.

The sealing film for a solar cell of the invention has adhesion strength, with respect to a glass substrate, of 13 N/cm or more, and particularly in the range of 15 to 25 N/cm after the sealing film is crosslinked so as to have a gel fraction of 80 to 95%, and subjected to ultraviolet light irradiation at a wavelength in the range of 295 to 400 nm and an intensity of 100 mW/cm$^2$ for 50 hours.

The sealing film for a solar cell of the present invention has difference (∠YI) between yellow indexes (YI values) before and after irradiation of 2.5 or less, particularly 2.0 or less, and most preferably 1.0 or less, after the sealing film is crosslinked so as to have a gel fraction of 80 to 95%, and subjected to ultraviolet light irradiation at a wavelength in the range of 295 to 400 nm and an intensity of 100 mW/cm$^2$ for 50 hours.

Moreover, the sealing film for a solar cell of the present invention has transmittance of light having a wavelength of 330 nm of 5% or less, and particularly 3% or less, after the sealing film is crosslinked so as to have a gel fraction of 80 to 95%, and subjected to ultraviolet light irradiation at a wavelength in the range of 295 to 400 nm and an intensity of 100 mW/cm$^2$ for 50 hours.

The gel fraction indicates crosslinkage degree in the sealing film for a solar cell. The measurements of the gel fraction, adhesion strength with respect to a glass substrate, difference (∠YI) between yellow indexes, and transmittance of light having a wavelength of 330 nm are carried out in accordance with methods described in the Examples below.

The structure of the solar cell including therein the sealing film of the invention is not particularly restricted. For example, the sealing film for a sealing film of the invention can be interposed between the light-receipt side transparent protection member and the back side protection member. The sealing film can be integrated with the light-receipt side and back side protection members by crosslinking. Thus, a structure is obtained wherein a photovoltaic cell is sealed with a sealing film.

FIG. 1 shows that a light-receipt side transparent protection member 11, light-receipt sealing film 13A, photovoltaic cell 14, back side sealing film 13B, and back side protection member 12 are superimposed on one another, and the sealing films are crosslinked/cured in accordance with a conventional method such as heat and pressure application thereto.

The thus obtained laminate is subjected to heat and pressure application at a temperature of 135 to 180° C., more preferably 140 to 180° C., in particular 155 to 180° C. by using a vacuum laminator with a degassing time of 0.1 to 5 minutes, a pressure of 0.1 to 1.5 kg/cm$^2$, and a pressure time of 5 to 15 minutes. When the heat and pressure application is carried out, ethylene-vinyl acetate copolymer included in the light receipt side sealing film 13A and the back side sealing film 13B is crosslinked. By the crosslinkage, the light-receipt side transparent protection member 11, back side transparent member 12 and photovoltaic cell 14 are integrated with each other via the light receipt side sealing film 13A and the back side sealing film 13B. Thus, the photovoltaic cell 14 can be sealed.

In the solar cell, the sealing film of the present invention can be used as at least one of the light-receipt side and back side sealing films. It is preferable that the sealing film of the invention is used at least as the light-receipt side sealing film, and particularly preferable that both the light-receipt side and back side sealing films are the sealing films of the invention.

In the present invention, a side of a photovoltaic cell from which the light is irradiated is referred to as "light-receipt side", and a reversed side, with respect to the light-receipt side, of photovoltaic cell is referred to as "bask side".

The light-receipt side transparent protection member of the solar cell of the invention is usually a glass substrate such as silicate glass. The thickness of the glass plate is generally in the range of 0.1 to 10 mm, preferably 0.3 to 5 mm. The glass plate can be thermally or chemically tempered.

The back side protection member for use in the present invention is a plastic film such as PET.

The solar cell of the present invention is characterized by the sealing films used on the light-receipt side and the back side. Namely, there is no particular restrictions on the members except for the sealing films. In other words, the light-receipt side transparent protection member, back side protection member, and photovoltaic cell can have structures/compositions as those in the known solar cell.

EXAMPLES

The present invention will now be explained by referring to Examples. The present invention is not restricted to the examples below.

Example 1

Materials with the formulation in Table 1 were supplied to a roll mill, and kneaded at 70° C. The obtained composition was formed by calendaring at a temperature of 70° C. After the formed composition was allowed to cool, a sealing film for a solar cell (thickness: 0.6 mm) was obtained.

In Table 1, the numeral/amount of the materials is based on a unit "parts by weight".

Examples 2 to 5 and Comparative Examples 1 to 6

Sealing films for a solar cell were prepared in the same way as in Example 1 except that the kind and/or the amount of the ultraviolet absorber were changed into those in Table 1.

[Evaluation of Ultraviolet Resistance]
1. Adhesion property
(1) Ultraviolet Light Irradiation A sealing film for a solar cell and PET release film (thickness: 0.075 mm) were superimposed on a glass substrate (thickness: 3 mm) in this order. The layers in the laminate were brought into pressure contact with each other at 90° C. under vacuum by use of a vacuum laminator for 2 minutes. Thereafter, pressure and heat were applied to the laminate at 155° C. for 45 minutes. Thus, a crosslinked/cured laminate having a gel fraction of 80% or more was obtained by crosslinking/curing the sealing film.

With respect to the crosslinked/cured laminate, an ultraviolet light having a wavelength of 295 to 400 nm was irradiated at an intensity of 100 mW/cm$^2$ for 50 hours under the atmosphere at a temperature of 63° C., by using Accelerated Weather-Resistance Tester (Eye Super I UV tester, manufactured by Iwasaki Electric Co., Ltd.) having a metal halide lamp as a light source. Thereafter, the laminate was taken out of the tester.

(2) Evaluation on Adhesion Property

In the laminate after the ultraviolet irradiation, the sealing film was partially released from the glass substrate, and the released part was folded by 180° turn. By using a tensile tester (Autograph AG-10KN, manufactured by Shimadzu Corporation), peal strength at a tensile speed of 100 mm/min was measured, as glass substrate adhesion property (N/cm). The results are shown in Table 1.

2. Yellow Index and Light Transmittance
(1) Ultraviolet Irradiation

A sealing film for a solar cell was interposed between two glass plates (thicknesses: 3.0 mm) so as to have a lamination order of glass plate/sealing film for a solar cell/glass plate. The thus obtained laminate was crosslinked/cured so as to have a gel fraction of 80% or more by the application of heat and pressure thereto under the same conditions as the above-mentioned evaluation of the adhesion property.

(2) Measurement of Yellow Index

The difference ($\angle$YI) between yellow indexes of the sealing film in the laminate before and after ultraviolet irradiation thereto was measured in accordance with JIS-K-7105-6 (1981) using Color Computer SM-5-IS-2B (manufactured by Suga Test Instruments Co., Ltd.). The results are shown in Table 1.

(3) Measurement of Light Transmittance

The transmittance of light having a wavelength of 330 nm was measured by a spectrometer (MPC 3100, manufactured by Shimadzu Corporation), with respect to the sealing film in the laminate after ultraviolet irradiation thereto. The results are shown in Table 1.

3. Gel Fraction

The gel fraction was determined as follows: The sealing film for a solar cell after crosslinking/curing was weighed (A g). Then, the sealing film was impregnated with xylene at 120° C. for 24 hours, and the insoluble content was filtrated by using a 200-mesh wire netting. The residue on the wire netting was subjected to vacuum drying, and the dried residue was weighted (B g). The gel fraction was obtained by calculation using the following formula:

$$\text{Gel fraction [wt. \%]} = (B/A) \times 100$$

TABLE 1

| | | Examples | | | | | Comparative Examples | | | | | |
|---|---|---|---|---|---|---|---|---|---|---|---|---|
| | | 1 | 2 | 3 | 4 | 5 | 1 | 2 | 3 | 4 | 5 | 6 |
| Formulation | EVA*[1] | 100 | 100 | 100 | 100 | 100 | 100 | 100 | 100 | 100 | 100 | 100 |
| | Organic Peroxide*[2] | 0.6 | 0.6 | 0.6 | 0.6 | 0.6 | 0.6 | 0.6 | 0.6 | 0.6 | 0.6 | 0 |
| | Benzophenone-based UV Absorber 1*[3] | 0 | 0 | 0 | 0 | 0 | 0.2 | 0 | 0.2 | 0 | 0 | 0 |
| | Benzotriazole-based UV Absorber 2*[4] | 0.1 | 0.05 | 0.3 | 0.3 | 0.3 | 0 | 1.5 | 0 | 0.4 | 0.1 | 0.1 |
| | Light Stabilizer*[5] | 0.1 | 0.1 | 0.1 | 0.3 | 1.5 | 0.1 | 0.1 | 0.2 | 1.5 | 2.5 | 0.1 |
| Evaluation on UV | Glass Substrate Adhesion Strength [N/cm] | 15 | 21 | 10 | 13 | 13 | 10 | 7 | 10 | 7 | 5 | 0 |

TABLE 1-continued

|  |  | Examples | | | | | Comparative Examples | | | | | |
| --- | --- | --- | --- | --- | --- | --- | --- | --- | --- | --- | --- | --- |
|  |  | 1 | 2 | 3 | 4 | 5 | 1 | 2 | 3 | 4 | 5 | 6 |
| resistance | Yellow Index ΔYI | 0.9 | 0.4 | 1.8 | 1.8 | 0.2 | 2.9 | 2.5 | 2.0 | 2.5 | 0.8 | 0.9 |
|  | Transmittance of Light (wavelength: 330 nm) [%] | 3.0 | 5.0 | 5.0 | 2.5 | 2.0 | 35.0 | 2.0 | 39.0 | 2.0 | 3.0 | 3.0 |

Note)
*[1]The content of vinyl acetate is 26 parts by weight, based on 100 parts by weight of EVA
*[2]2,5-dimethyl-2,5-bis(t-butylperoxy)hexane
*[3]2-hydroxy-4-n-oxtoxybenzophenone
*[4]2-(2H-benzotriazol-2-yl)-6-dodecyl-4-methylphenol
*[5]bis(2,2,6,6-tetraethyl-4-piperidyl)sebacate In the above Examples, it can be seen that the sealing film of the invention has excellent glass substrate adhesion property, small yellow index, and large absorption of an ultraviolet light having a wavelength of 330 nm even after ultraviolet irradiation to the sealing film for a long time.

INDUSTRIAL FIELD FOR UTILIZATION

Through the sealing film of the present invention, incident light can be efficiently taken into the photovoltaic cell, even after the sealing film is installed, for a long time, under severe conditions, for instance at an outdoor location wherein lights tend to affect. Therefore, it is possible to provide a solar cell having excellent power generating property by using the sealing film of the present invention.

The invention claimed is:

1. A sealing film for a solar cell, comprising:
ethylene-vinyl acetate copolymer;
an organic peroxide;
a benzotriazole-based ultraviolet absorber; and
a hindered amine-based light stabilizer;
the content of the benzotriazole-based ultraviolet absorber being in the range of 0.05 to 0.1 parts by weight, based on 100 parts by weight of ethylene-vinyl acetate copolymer, and the content of the hindered amine-based light stabilizer being in the range of 0.01 to 2 parts by weight, based on 100 parts by weight of ethylene-vinyl acetate copolymer.

2. The sealing film for a solar cell as defined in claim 1, wherein the content of the hindered amine-based light stabilizer is in the range of 0.05 to 1.5 parts by weight, based on 100 parts by weight of ethylene-vinyl acetate copolymer.

3. The sealing film for a solar cell as defined in claim 1, wherein the weight ratio of the benzotriazole-based ultraviolet absorber and hindered amine-based light stabilizer is in the range of 1:1 to 1:5.

4. The sealing film for a solar cell as defined in claim 1, wherein the benzotriazole-based ultraviolet absorber is 2-(2H-benzotriazol-2-yl)-6-dodecyl-4-methylphenol, 2-[5-chloro(2H)-benzotriazol-2-yl]-4-methyl-6-tert-butylphenol, and/or 2,2'-methylenebis-[6-(2H-benzotriazole-2-yl)-4-(1,1,3,3-tetramethylbutyl) phenol.

5. The sealing film for a solar cell as defined in claim 1, wherein the hindered amine-based light stabilizer is bis(2,2,6,6-tetramethyl-4-piperidyl) sebacate, and/or poly[{6-(1,1,3,3-tetramethylbutyl)amino-1,3,5-triazine-2,4-diyl} {(2,2,6,6-tetramethyl-4-piperidyl)imino}hexamethylene{(2,2,6,6-tetramethyl-4-piperidyl)imino}].

6. The sealing film for a solar cell as defined in claim 1, wherein the organic peroxide is at least one material selected from a group consisting of hydroperoxide-based compounds, dialkylperoxide-based compounds and ketone peroxide-based compounds.

7. The sealing film for a solar cell as defined in claim 1, wherein the content of the organic peroxide is in the range of 0.2 to 1.5 parts by weight, based on 100 parts by weight of ethylene-vinyl acetate copolymer.

8. The sealing film for a solar cell as defined in claim 1, wherein the content of vinyl acetate in ethylene-vinyl acetate copolymer is in the range of 20 to 35 parts by weight, based on 100 parts by weight of ethylene-vinyl acetate vinyl copolymer.

9. A solar cell comprising the sealing film for a solar cell as claimed in claim 1.

* * * * *